(12) United States Patent
Nakayama et al.

(10) Patent No.: US 11,239,101 B2
(45) Date of Patent: Feb. 1, 2022

(54) WAFER SUPPLY DEVICE

(71) Applicant: FUJI CORPORATION, Chiryu (JP)

(72) Inventors: Yukinori Nakayama, Hekinan (JP); Shinichi Fujii, Kariya (JP)

(73) Assignee: FUJI CORPORATION, Chiryu (JP)

( * ) Notice: Subject to any disclaimer, the term of this patent is extended or adjusted under 35 U.S.C. 154(b) by 329 days.

(21) Appl. No.: 16/490,952

(22) PCT Filed: Mar. 9, 2017

(86) PCT No.: PCT/JP2017/009617
§ 371 (c)(1),
(2) Date: Sep. 4, 2019

(87) PCT Pub. No.: WO2018/163389
PCT Pub. Date: Sep. 13, 2018

(65) Prior Publication Data
US 2020/0013651 A1 Jan. 9, 2020

(51) Int. Cl.
*H01L 21/67* (2006.01)
*B65G 47/91* (2006.01)
*G05B 19/418* (2006.01)

(52) U.S. Cl.
CPC ........ *H01L 21/67294* (2013.01); *B65G 47/91* (2013.01); *G05B 19/4183* (2013.01); *H01L 21/67144* (2013.01); *G05B 2219/45031* (2013.01); *G05B 2219/45063* (2013.01)

(58) Field of Classification Search
CPC ................ B65G 47/91; G05B 19/4183; G05B 2219/45031; G05B 2219/45063; H01L 21/67144; H01L 21/67294
See application file for complete search history.

(56) References Cited

U.S. PATENT DOCUMENTS

2013/0160952 A1* 6/2013 Hwang ............. H01L 21/67144
156/556
2018/0144971 A1* 5/2018 Peterson ........... H01L 21/67132

FOREIGN PATENT DOCUMENTS

| JP | 3-161942 A | 7/1991 |
| JP | 8-264998 A | 10/1996 |
| WO | WO 2013/161173 A1 | 10/2013 |
| WO | WO 2013/108366 A1 | 5/2015 |

* cited by examiner

*Primary Examiner* — Michael J Huntley
(74) *Attorney, Agent, or Firm* — Oblon, McClelland, Maier & Neustadt, L.L.P.

(57) ABSTRACT

A wafer supply device configured to supply a wafer divided into multiple dies to a supply position, the wafer supply device includes a die information storage section configured to store the number of dies for each rank allocated to each of the dies, a block information acquisition section configured to acquire a condition of dies to be mounted on a block provided on a board to be conveyed, a required block number acquisition section configured to acquire a required number of dies to be mounted on the block, and a producible number calculation section configured to calculate a number of blocks that can be produced based on a content stored in the die information storage section and a content acquired by the block information acquisition section and the required block number acquisition section.

6 Claims, 6 Drawing Sheets

WAFER SUPPLY DEVICE

TECHNICAL FIELD

The present application relates to a wafer supply device.

BACKGROUND ART

Patent Literature 1 discloses a technique of calculating the maximum number of boards that can be produced using the number of components remaining in component supplying means such as a component tape. Patent Literature 2 discloses a technique in which each pellet is classified (ranked) into multiple categories based on electrical characteristics of the pellet (die), and the order of picking up the pellets is determined based on the category classification.

PATENT LITERATURE

Patent Literature 1: JP-A-8-264998
Patent Literature 2: JP-A-3-161942

BRIEF SUMMARY

Technical Problem

As in the technique described in Patent Literature 2 described above, when it is necessary to mount multiple pellets having successive electrical characteristics or category classification on one board, it is not possible to calculate the number of producible boards using the technique described in Patent Literature 1 as it is. In particular, in the case of a production mode in which a wafer cannot be exchanged in the middle of production, an incomplete board is generated when a component runs out in the middle of production.

An object of the present disclosure is to provide a wafer supply device capable of preventing generation of an incomplete board.

Solution to Problem

The present description discloses a wafer supply device configured to supply a wafer divided into multiple dies to a supply position. The wafer supply device includes a die information storage section configured to store the number of the dies for each rank allocated to each of the dies, a block information acquisition section configured to acquire a condition of the dies to be mounted on a block provided on a board to be conveyed, a required block number acquisition section configured to acquire a required number of the dies to be mounted on the block, and a producible number calculation section configured to calculate the number of the blocks that can be produced based on a content stored in the die information storage section and a content acquired by the block information acquisition section and the required block number acquisition section.

Advantageous Effects

With this wafer supply device, the producible number calculation section calculates the number of producible blocks based on the content stored in the die information storage section and the content acquired by the block information acquisition section. As a result, the number of producible blocks can be obtained in advance, so that it is possible to prevent an incomplete board from being generated due to a shortage of dies.

DESCRIPTION OF EMBODIMENTS

1. First Embodiment

1-1: Configuration of Component Mounter 1

Hereinafter, embodiments to which the wafer supply device according to the present disclosure is applied will be described with reference to the drawings. First, with reference to FIG. 1, a schematic configuration of component mounter 1 using wafer supply device 20 according to the first embodiment will be described.

Figure 1:
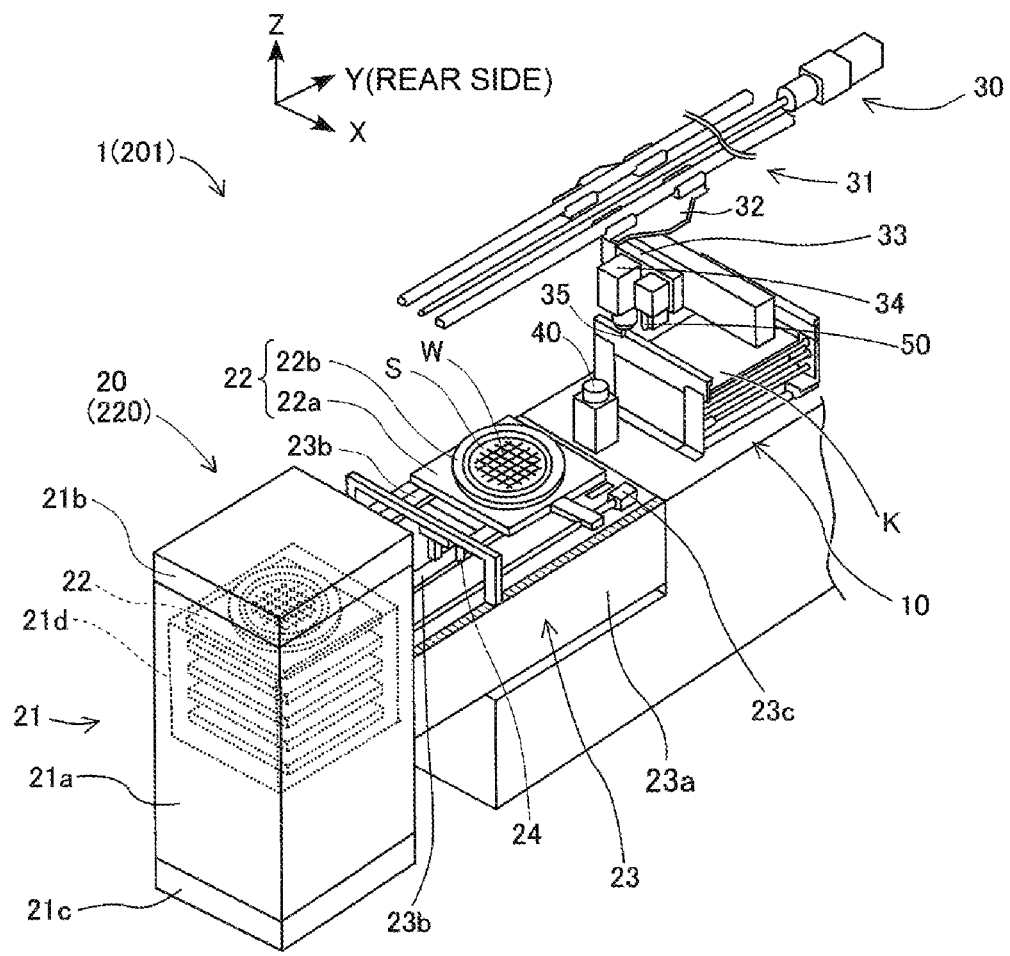
FIG. 1 is a perspective view of a component mounter according to a first embodiment disclosed in the present description.
Figure 3:
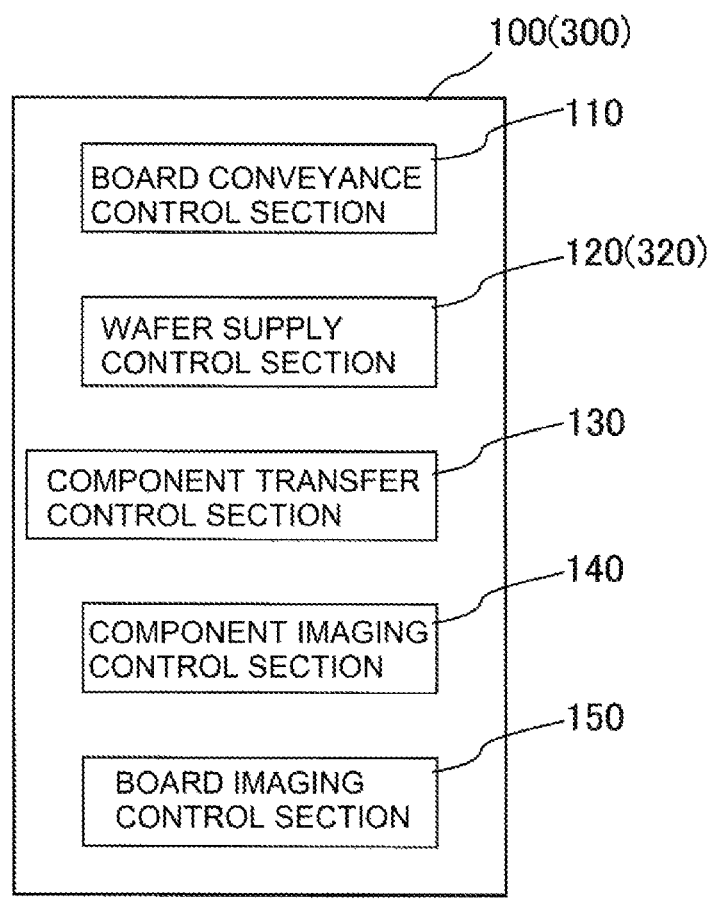
FIG. 3 is a block diagram of the component mounter.

As shown in FIG. 1, component mounter 1 mainly includes board conveyance device 10, wafer supply device 20, component transfer device 30, component imaging device 40, board imaging device 50, and control device 100 (see FIG. 3). In FIG. 1, the direction in which board K is conveyed is defined as the X-axis direction, and the horizontal direction orthogonal to the X-axis direction is defined as the Y-axis direction, and the vertical direction perpendicular to the X-axis direction and the Y-axis direction is defined as the Z-axis direction.

Board conveyance device 10 carries in and out board K on which a component is to be mounted. Board conveyance device 10 positions board K carried into the machine of component mounter 1, and after the components are mounted on board K, board K is carried out to the outside of the machine of component mounter 1.

Wafer supply device 20 mainly includes magazine storage section 21, multiple wafer pallets 22, pallet conveyance mechanism 23, and wafer imaging device 24. Magazine storage section 21 is formed by vertically long rectangular parallelepiped housing 21a. Pallet carrying-in section 21b is provided at the upper portion of housing 21a, and pallet discharging section 21c is provided at the lower portion of housing 21a. Magazine 21d is stored in housing 21a. Magazine 21d is a box-shaped member having multiple storage racks, and is provided so as to be vertically movable with respect to housing 21a. Each storage rack of magazine 21d stores wafer pallet 22 so that it can be pulled out. The wafer pallet 22 is carried in from the pallet carrying-in section 21b, stored in the magazine 21d, and discharged from the pallet discharging section 21c after use.

Wafer pallet 22 includes pallet frame 22a and expanding table 22b. Pallet frame 22a is a frame body having a hole at the center, and expanding table 22b is an annular member provided around the hole on the upper face of pallet frame 22a.

Expanding table 22b holds the periphery of dicing sheet S in a state where tension is applied to dicing sheet S. Wafer W divided into multiple dies D by a dicing process adheres to dicing sheet S.

Pallet conveyance mechanism 23 is provided behind magazine storage section 21. Pallet conveyance mechanism 23 mainly includes horizontally long rectangular parallelepiped main body section 23a, pair of guide rails 23b, and ball screw feed mechanism 23c. Wafer pallet 22 is pulled out from magazine 21d by ball screw feed mechanism 23c, and conveyed to the supply position along pair of guide rails 23b. Wafer pallet 22 at the supply position is returned to magazine 21d by ball screw feed mechanism 23c. FIG. 1 shows a state in which one wafer pallet 22 is conveyed to the supply position. Wafer imaging device 24 is a camera that images wafer W from above.

Figure 2:
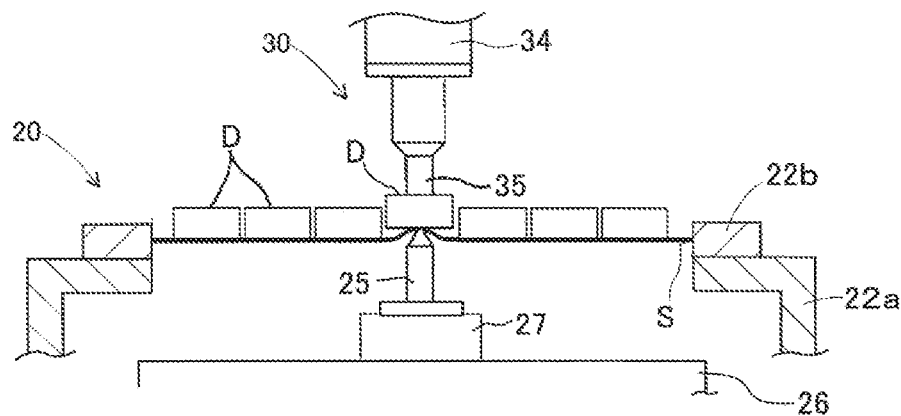
FIG. 2 is a view of a push-up pot of a wafer supply device from a side face.

As shown in FIG. 2, wafer supply device 20 further includes push-up pot 25, pot moving device 26, and pot lifting and lowering device 27. Push-up pot 25 pushes up die D together with dicing sheet S from below when die D is picked up.

Pot moving device 26 is disposed inside pallet frame 22a and is provided so as to be movable in the X-direction and the Y-direction (front-rear, left-right direction in FIG. 2). Pot lifting and lowering device 27 is provided on the upper face of pot moving device 26, and is provided so as to be vertically movable in the Z-direction (up-down direction in FIG. 2). Push-up pot 25 is provided on the upper face of pot lifting and lowering device 27, and pot lifting and lowering device 27 and push-up pot 25 move in the X-direction and the Y-direction along with the movement of pot moving device 26. Then, push-up pot 25 is lifted as pot lifting and lowering device 27 is lifted and pushes up die D from below via dicing sheet S.

In addition, component mounter 1 is provided with various motors (not shown) for driving wafer supply device 20. The various motors for driving wafer supply device 20 include motors for driving magazine 21d, pot moving device 26, and pot lifting and lowering device 27.

Returning to FIG. 1, the description will be continued. Component transfer device 30 mainly includes head driving device 31, moving body 32, and mounting head 33. Head driving device 31 is provided so as to be able to move moving body 32 in the X-axis direction and the Y-axis direction by a linear motion mechanism. Mounting head 33 is fixed to moving body 32 via a frame (not shown). Mounting head 33 holds die D, which is a component supplied to the supply position, and mounts die D to positioned board K. Mounting head 33 is detachably provided with holding tool 34, and holding tool 34 is provided with multiple rotatably and vertically movable component holding sections 35. Component holding section 35 is a nozzle for detachably holding die D by pickup suction.

Component mounter 1 is provided with various motors (not shown) for driving component transfer device 30. Various motors for driving component transfer device 30 include an X-axis motor for moving the moving body 32 in the X-axis direction, a Y-axis motor for moving the moving body 32 in the Y-axis direction, an R-axis motor for rotating mounting head 33 about the Z-axis, and a θ-axis motor for rotating each of multiple component holding sections 35 about the Z-axis.

Component imaging device 40 is a camera provided between board conveyance device 10 and wafer supply device 20, and captures an image of die D held by component holding section 35 from below. Board imaging device 50 is a camera provided on moving body 32, and images board K from above.

As shown in FIG. 3, control device 100 mainly includes board conveyance control section 110, wafer supply control section 120, component transfer control section 130, component imaging control section 140, and board imaging control section 150. Board conveyance control section 110 is provided in board conveyance device 10. Board conveyance device 10 performs control related to carrying-in, positioning, and carrying-out of board K. Wafer supply control section 120 is provided in wafer supply device 20. Wafer supply control section 120 performs general control on wafer supply device 20. Details of wafer supply control section 120 will be described later.

Component transfer control section 130 is provided in component transfer device 30. Component transfer control section 130 controls the position of moving body 32 and the pickup suction operation and the mounting operation of die D by component holding section 35 by performing drive control of various motors. Component imaging control section 140 is provided in component imaging device 40. Component imaging device 40 captures an image by component imaging device 40, and detects a holding position, an angle, and the like of die D held by component holding section 35 based on the image capturing result. Component transfer control section 130 changes the direction of die D held by component holding section 35 by controlling various motors as necessary. Board imaging control section 150 is provided in board imaging device 50. Board imaging control section 150 captures an image of the position mark attached to the surface of board K by board imaging device 50, and obtains an error in the mounting position of die D based on the image capturing result. Component transfer control section 130 controls various motors as necessary and corrects the mounting position of die D with respect to board K.

1-2: Wafer Supply Control Section 120

Figure 4:
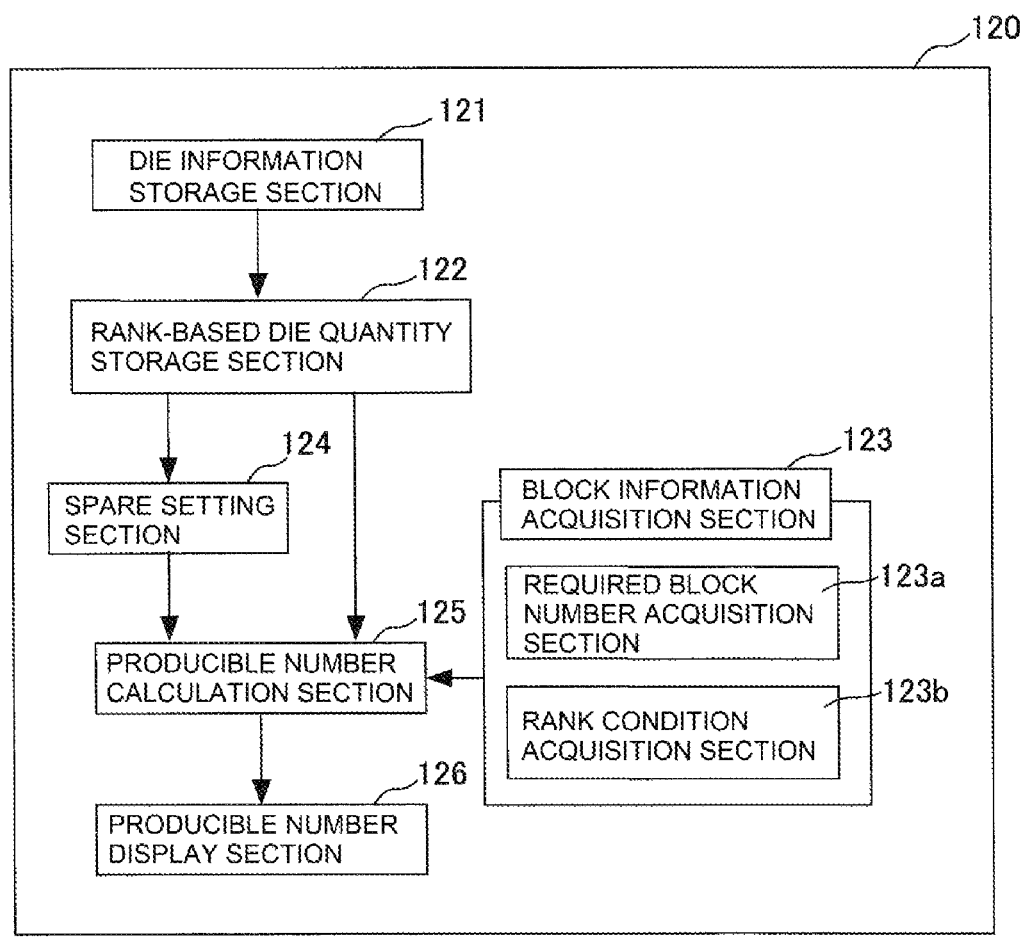
FIG. 4 is a block diagram of a wafer supply control section.

Next, wafer supply control section 120 will be described with reference to FIG. 4. As shown in FIG. 4, wafer supply control section 120 includes die information storage section 121, rank-based die number storage section 122, block information acquisition section 123, spare setting section 124, producible number calculation section 125, and producible number display section 126.

Die information storage section 121 stores information on dies D included in all wafers W stored in magazine 21d. Here, before wafer W is stored in magazine 21d, each die D included in wafer W is ranked based on predetermined characteristics (such as a resistance value and a frequency). Die information storage section 121 stores information on the position of each of dies D stored included in wafer W in association with a rank assigned to each of dies D. Wafer W is provided with a bar code associated with information on the position and rank of die D. Component mounter 1 reads a bar code by a bar code reader (not shown) provided in wafer supply device 20, thereby acquiring information on dies D included in wafer W and storing the information in die information storage section 121.

Rank-based die number storage section 122 stores the number of dies D included in wafer W by rank based on the content stored in die information storage section 121. Block information acquisition section 123 acquires and stores information on board K conveyed to board conveyance device 10. More specifically, a block serving as a mounting position of die D is provided on the upper face of board K, and block information acquisition section 123 acquires and stores information on the condition of die D to be mounted on the block. The information on the condition of die D to be mounted on the block may be stored in advance as information on board K, or may be input by an operator.

Block information acquisition section 123 mainly includes required block number acquisition section 123a and rank condition acquisition section 123b. Required block number acquisition section 123a acquires and stores the required number of dies D to be mounted on one block. Rank condition acquisition section 123b acquires and stores a condition relating to the rank of die D to be mounted on one block.

Spare setting section 124 sets the number of spare dies D to be secured for recovery. That is, during the mounting work of die D, there is a concern that a component defect of die D, a pickup suction error by component holding section 35, or the like may occur. On the other hand, in component mounter 1, by securing die D for use in recovery in advance, even if a component defect, a pickup suction error, or the like occurs, it is possible to suppress the occurrence of a shortage in the number of dies D required for mounting the block. As a result, component mounter 1 can prevent an incomplete block from being generated.

The number of spare dies D to be set in spare setting section 124 may be set as an input value by an operator, or may be set as a value calculated based on a recovery rate inferred from past statistical data.

Producible number calculation section 125 calculates the number of producible blocks using dies D stored in magazine 21d based on the content acquired by block information acquisition section 123 and the content stored in rank-based die number storage section 122. Producible number calculation section 125 calculates the producible number by subtracting in advance the number of spare dies D set in spare setting section 124 from the total number of dies D for each rank. In producible number display section 126, the value calculated by producible number calculation section 125 is displayed so as to be visible by the operator.

(1-3: Producible Number Calculation Processing)

Here, with reference to FIG. 5, the producible number calculation processing executed by wafer supply control section 120 will be described. The producible number calculation processing is processing executed when calculating the number of producible blocks using die D included in one wafer W.

Figure 5:
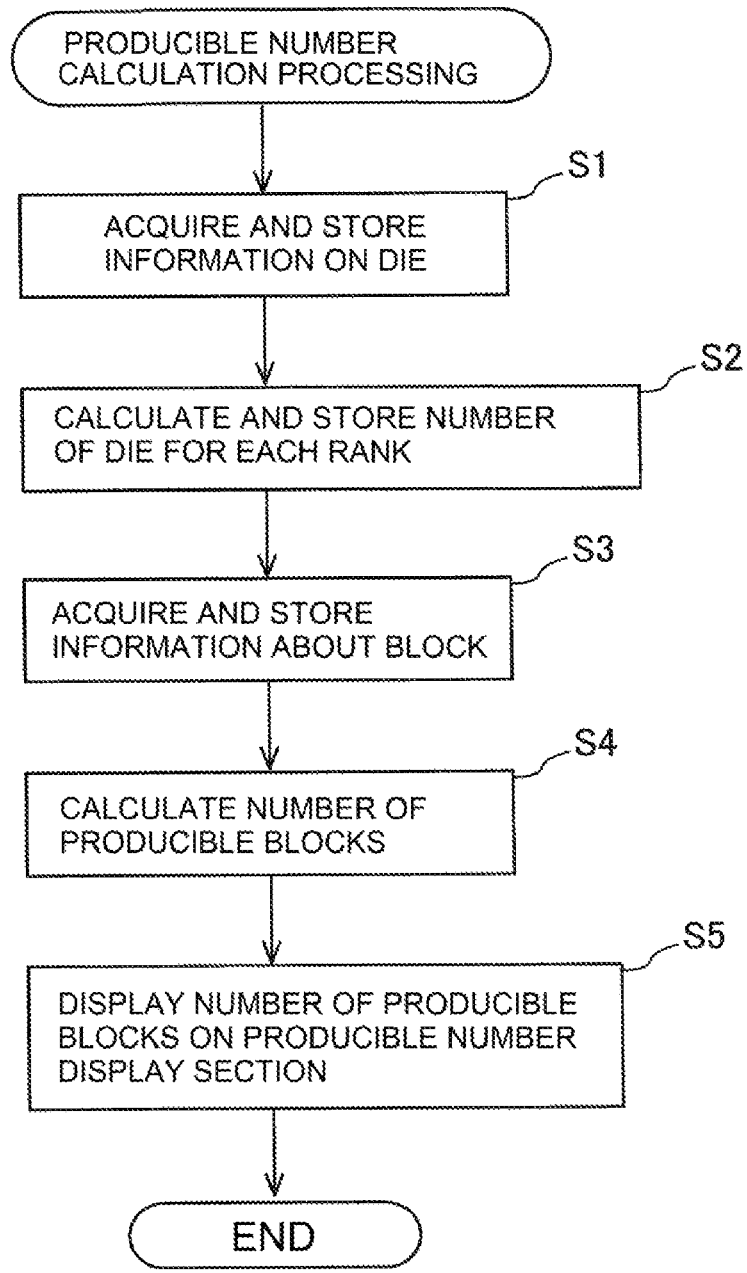
FIG. 5 is a flowchart showing producible number calculation processing performed by the wafer supply control section.

As shown in FIG. 5, in the producible number calculation processing, wafer supply control section 120 first reads the bar code attached to wafer W, acquires information on die D of wafer W, and stores the acquired information on die D in die information storage section 121 (S1).

Next, wafer supply control section 120 calculates the number of dies D included in wafer W for each rank, and stores the calculated number in rank-based die number storage section 122 (S2). After processing of S2, block information acquisition section 123 acquires information about the block on which die D is to be mounted and stores the information (S3).

Subsequently, producible number calculation section 125 obtains the number of dies D mountable on the block based on the condition regarding the rank of dies D mounted on one block acquired by block information acquisition section 123 and the number of dies D by rank included in wafer W stored in die information storage section 121. The number of producible blocks using dies D included in wafer W is calculated based on the obtained number of dies D and the required number of dies D to be mounted on one block acquired by block information acquisition section 123 (S4).

Thereafter, wafer supply control section 120 displays the value calculated by producible number calculation section 125 on producible number display section 126 (S5), and ends the present processing.

In this manner, wafer supply device 20 calculates the number of producible blocks using die D included in wafer W. As a result, wafer supply device 20 can obtain in advance the producible number of blocks, thereby preventing the generation of incomplete board K due to the shortage of die D. Further, since wafer supply device 20 displays the calculated producible number on producible number display section 126, the operator can obtain the number of producible blocks in advance, thereby efficiently performing the mounting work of the components.

As described above, wafer supply device 20 includes producible number calculation section 125, and producible number calculation section 125 calculates the number of producible blocks based on the content stored in die information storage section 121 and the content acquired by block information acquisition section 123 and required block number acquisition section 123a. As a result, wafer supply devices 20 and 220 can obtain in advance the number of producible blocks, thereby preventing the generation of incomplete board K due to the shortage of die D.

The result calculated by producible number calculation section 125 is displayed on producible number display section 126. As a result, the operator can obtain the number of producible blocks in advance, so that the mounting work of die D as a component can be performed efficiently.

In addition, a part of dies D stored in wafer supply device 20 is set as spare die D used for recovery for each rank in spare setting section 124. Then, producible number calculation section 125 calculates the producible number of blocks in a state in which the number of spare dies D set for each rank by spare setting section 124 is subtracted from the total number of dies D, for each rank stored in wafer supply device 20. As a result, even if a component defect, a pickup error, or the like occurs, wafer supply device 20 can suppress the occurrence of a shortage in the number of dies D required for mounting the block. Therefore, wafer supply device 20 can prevent an incomplete block from being generated due to a component defect, a pickup error, or the like.

2. Second Embodiment

Next, the second embodiment will be described. In the first embodiment, a case has been described in which the number of producible blocks is calculated using dies D included in one wafer W. On the other hand, in the second embodiment, dies D included in a lot having of one wafer or multiple wafers are used to determine whether it includes dies D required to produce a scheduled production number of blocks. Components identical to those of the first embodiment are denoted by the same reference numerals, and descriptions thereof are omitted. Component mounter 201 according to the second embodiment has the same configuration as component mounter 1 according to the first embodiment except for wafer supply control section 320 included in wafer supply device 220.

2-1: Wafer Supply Control Section 320

Figure 6:
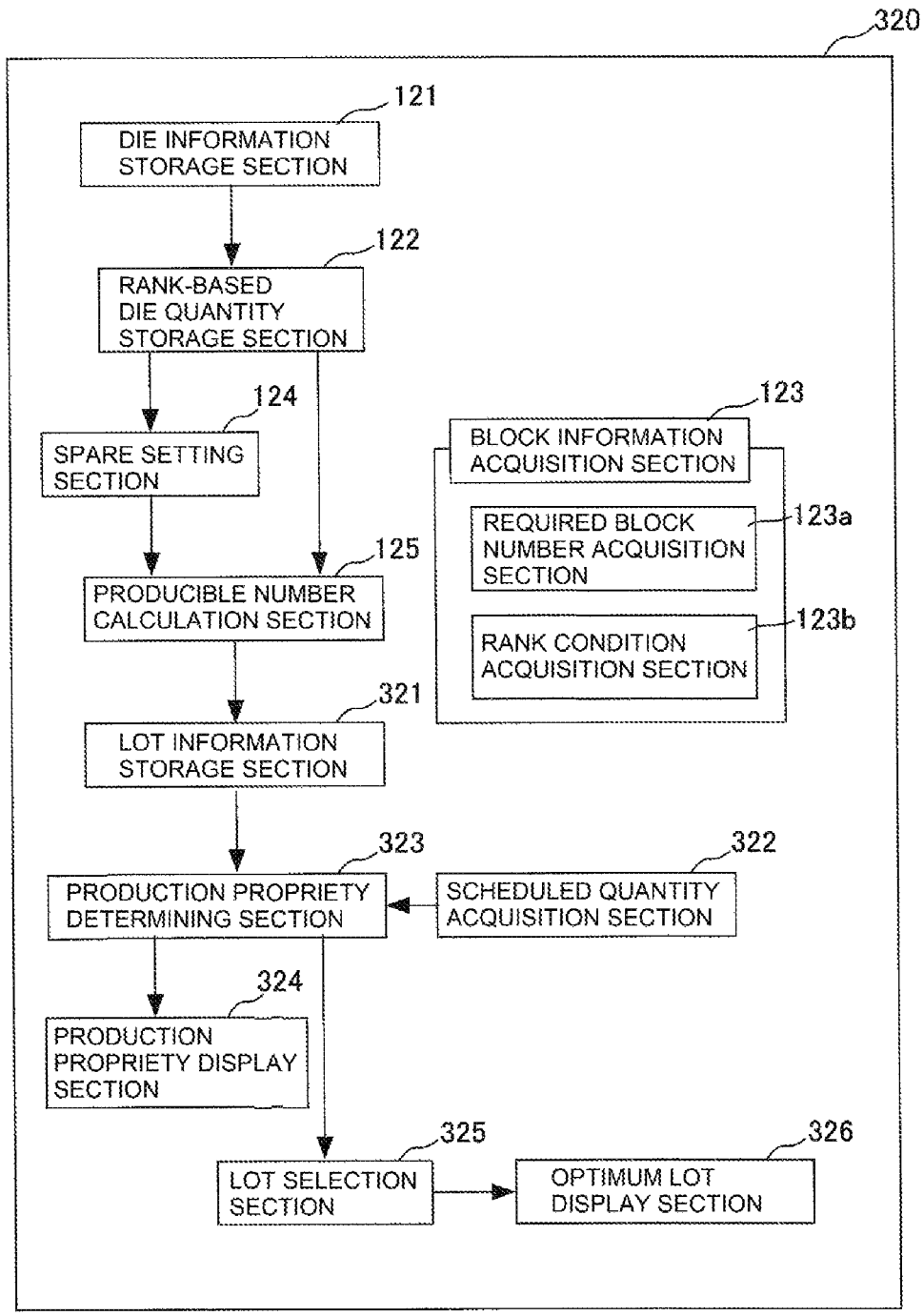
FIG. 6 is a block diagram of a wafer supply control section according to a second embodiment.

First, with reference to FIG. 6, wafer supply control section 320 according to the second embodiment will be described. As shown in FIG. 6, wafer supply control section 320 further includes die information storage section 121, rank-based die number storage section 122, block information acquisition section 123, spare setting section 124, producible number calculation section 125, lot information storage section 321, scheduled number acquisition section 322, production propriety determining section 323, and production propriety display section 324.

Lot information storage section 321 stores information on a lot having of one wafer or multiple wafers W. Lot information storage section 321 stores information on multiple lots. The type of lot stored in lot information storage section 321 and the number of wafers W included in the lot vary.

Scheduled number acquisition section 322 acquires the scheduled production number of the blocks. Production propriety determining section 323 determines whether each lot stored in lot information storage section 321 includes dies D sufficient to produce the scheduled production number of blocks acquired by scheduled number acquisition section 322. On production propriety display section 324, the determination result by production propriety determining section 323 is displayed so as to be visually recognizable by the operator.

Wafer supply control section 320 further includes lot selection section 325 and optimum lot display section 326. Lot selection section 325 selects an optimum lot when there are multiple lots including dies D sufficient to produce a scheduled production number of blocks among the lots stored in lot information storage section 321. Optimum lot display section 326 displays the lot selected by lot selection section 325 so that the lot can be visually recognized by the operator.

Specifically, when there are multiple lots including dies D sufficient to produce the scheduled production number of blocks, lot selection section 325 selects the lot in which the number of dies D remaining at the time of the end of production is the smallest as the optimum lot.

As a result, wafer supply device 220 can minimize the number of dies D remaining in the lot at the point of time of the end of the production of the scheduled production number of blocks. Further, when more dies D are required in a later mounting work of dies D, wafer supply device 220 can use a lot including more dies D in the mounting work of dies D. Therefore, wafer supply device 220 can efficiently use die D. Further, the operator can easily obtain the optimum lot by checking optimum lot display section 326. Therefore, wafer supply device 220 can improve the working efficiency of the die as a component.

2-2: Production Propriety Determination Processing

Next, with reference to FIG. 7, the production propriety determination processing executed by wafer supply control section 320 will be described. The production propriety determination processing determines whether the lot contains the dies sufficient to produce a scheduled production number of blocks for one lot.

Figure 7:
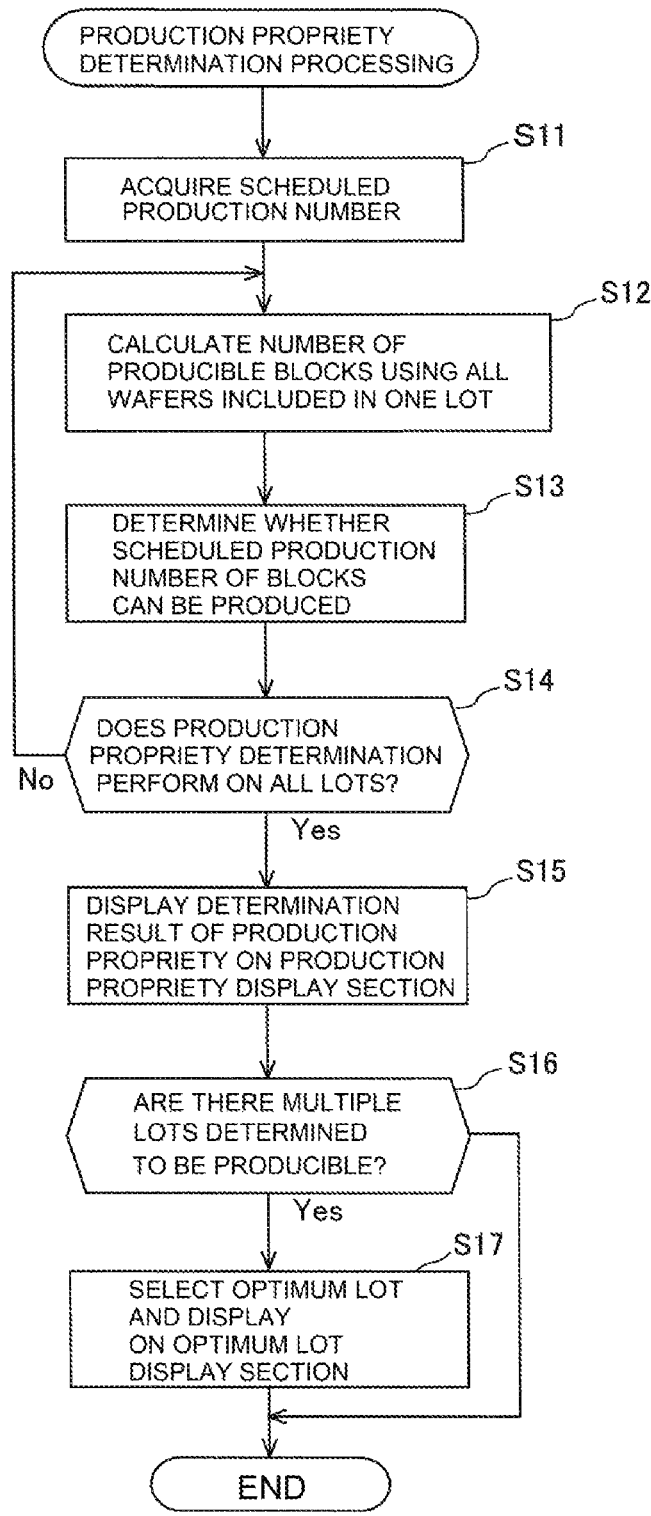
FIG. 7 is a flowchart showing production propriety determination processing performed by the wafer supply control section.

As shown in FIG. 7, in the production propriety determination processing, first, scheduled number acquisition section 322 acquires the value of the scheduled production number of blocks (S11). Next, wafer supply control section 320 calculates the number of producible blocks using all wafers W included in the lot for one lot stored in lot information storage section 321 (S12).

In the processing of S12, wafer supply control section 320 executes the processing of S1 to S4 executed in the producible number calculation processing in the first embodiment for each wafer W included in the lot, and calculates the number of producible blocks using each wafer W included in the lot for each wafer W. Thereafter, wafer supply control section 320 sums the number of producible wafers calculated for each wafer W, and calculates the number of producible blocks using all wafers W included in the lot.

After the processing of S12, production propriety determining section 323 determines whether the scheduled production number of blocks can be produced using the lot (S13). That is, in the processing of S13, production propriety determining section 323 determines whether the lot includes dies D sufficient to produce the scheduled production number of blocks acquired by scheduled number acquisition section 322. After the processing of S13, it is determined whether the production propriety determination by production propriety determining section 323 has been performed on all the lots stored in lot information storage section 321 (S14). When the production propriety determination has not yet been performed for all the lots (S14: No), the production propriety determination processing returns to the processing of S12, and the production propriety determination is executed for the remaining lots for which the production propriety determination has not been performed.

On the other hand, when the production propriety determination for the lot is completed (S14: Yes), wafer supply control section 320 displays the determination result by production propriety determining section 323 on production propriety display section 324 (S15). For example, wafer supply control section 320 displays only the lot determined by production propriety determining section 323 to be producible on production propriety display section 324. At this time, wafer supply control section 320 may display the number of producible blocks using the lot determined to be producible on production propriety determining section 323 together with the display of the lot determined to be producible.

In this manner, wafer supply device 220 can obtain in advance whether the scheduled production number of blocks can be produced by using dies D included in the lot. Therefore, wafer supply device 220 can prevent the generation of incomplete board K caused by the shortage of die D. In addition, the operator can obtain the producible lot in advance by checking the determination result displayed on production propriety display section 324. Therefore, wafer supply device 220 can prevent the generation of an incomplete block caused by the shortage of die D.

Next, wafer supply control section 120 determines whether there are multiple lots determined to be producible by production propriety determining section 323 in the lots stored in lot information storage section 321 (S16). If multiple lots determined to be producible are not included (S16: No), the processing ends. On the other hand, when there are multiple lots determined to be producible (S16: Yes), lot selection section 325 selects an optimum lot from among the multiple lots determined to be capable of producing the scheduled production number of blocks and displays the lot (S17), and ends the present processing. In the processing of S17, a lot in which the number of dies D remaining at the time of the end of production is the smallest is selected as an optimum lot from among the multiple lots determined to be capable of producing the scheduled production number of blocks.

As described above, wafer supply device 220 includes production propriety determining section 323, and production propriety determining section 323 determines whether the lot stored in lot information storage section 321 includes dies D sufficient to produce the scheduled production number of blocks acquired by scheduled number acquisition section 322. Thereby, wafer supply device 220 can obtain in advance whether the scheduled production number of blocks can be produced by using dies D included in the lot.

Therefore, wafer supply device 220 can prevent the generation of incomplete board K caused by the shortage of die D.

Further, the determination result by production propriety determining section 323 is displayed on production propriety display section 324. Therefore, the operator can obtain the producible lot in advance by checking the determination result displayed on production propriety display section 324. Therefore, wafer supply device 220 can prevent the generation of an incomplete block caused by the shortage of die D.

When there are multiple lots including dies D sufficient to produce the scheduled production number of blocks among the lots stored in lot information storage section 321, lot selection section 325 selects a lot in which the number of dies D remaining at the end of production is smallest. As a result, wafer supply device 220 can minimize the number of dies D remaining in the lot at the point of time of the end of the production of the scheduled production number of blocks. Further, when more dies D are required in a later mounting work of dies D, wafer supply device 220 can use a lot including more dies D in the mounting work of dies D. Therefore, wafer supply device 220 can efficiently use die D as a component.

Further, the lot selected by lot selection section 325 is displayed as an optimum lot on optimum lot display section 326. Therefore, since the operator can easily obtain the optimum lot by checking optimum lot display section 326, the working efficiency of the die as a component can be improved.

3. Other

Although the present disclosure has been described based on the above-described embodiments, the present disclosure is not limited to the above-described embodiments, and it can be easily inferred that various modifications and improvements can be made within a range not departing from the scope of the present disclosure.

For example, in the first embodiment, a case has been described in which producible number calculation section 125 calculates the number of producible blocks by dies D included in one wafer W, and the calculated result is displayed on producible number display section 126, but the present disclosure is not limited thereto. For example, the number of producible blocks by all dies D included in the lot may be calculated, and the result may be displayed on producible number display section 126.

REFERENCE SIGNS LIST 20, 220: wafer supply device; 121: die information storage section; 122: rank-based die number storage section; 123: block information acquisition section; 123a: required block number acquisition section; 124: spare setting section; 125: producible number calculation section; 126: producible number display section; 321: lot information storage section; 322: scheduled number acquisition section; 323: production propriety determining section; 324: production propriety display section; 325: lot selection section; 326: optimum lot display section; D: die; K: board; W: wafer

The invention claimed is:

1. A wafer supply device configured to supply a wafer divided into multiple dies to a supply position, the wafer supply device comprising:
   a die information storage section configured to store a number of the dies for each rank allocated to each of the dies;
   a block information acquisition section configured to acquire a condition of the dies to be mounted on a block provided on a board to be conveyed;
   a required block number acquisition section configured to acquire a required number of the dies to be mounted on the block; and
   a producible number calculation section configured to calculate a number of producible blocks based on a content stored in the die information storage section and a content which is acquired by the block information acquisition section and the required block number acquisition section;
   a spare setting section configured to set a part of the dies stored in the wafer supply device as spare dies to be used for recovery, for each rank; and
   a control section configured to populate the board based on the calculated number of producible blocks,
   wherein the producible number calculation section calculates a producible number of the blocks in a state where the number of the spare dies set for each rank by the spare setting section is subtracted from a total number of the dies, for each rank stored in the wafer supply device.

2. The wafer supply device according to claim 1, further comprising:
   a producible number display section configured to display a result calculated by the producible number calculation section.

3. The wafer supply device according to claim 1, further comprising:
   a scheduled number acquisition section configured to acquire a scheduled production number of the blocks;
   a lot information storage section configured to store a number of the dies included in a lot having of one wafer or multiple wafers for each rank, and
   a production propriety determining section configured to determine whether the lot stored in the lot information storage section includes dies sufficient to produce the scheduled production number of the blocks acquired by the scheduled number acquisition section.

4. The wafer supply device according to claim 3, further comprising:
   a production propriety display section configured to display a determination result by the production propriety determining section.

5. The wafer supply device according to claim 4, further comprising:
   a lot selection section configured to select the lot having a number of dies remaining at the end of production when there are multiple lots including the dies sufficient to produce the scheduled production number of the blocks acquired by the scheduled number acquisition section among the lots stored in the lot information storage section.

6. The wafer supply device according to claim 5, further comprising:
   an optimum lot display section configured to display the lot selected by the lot selection section as an optimum lot.

* * * * *